United States Patent
Witt

(10) Patent No.: US 7,696,093 B2
(45) Date of Patent: Apr. 13, 2010

(54) METHODS FOR FORMING COPPER INTERCONNECTS FOR SEMICONDUCTOR DEVICES

(75) Inventor: Christian A. Witt, Woodbridge, CT (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/190,428

(22) Filed: Aug. 12, 2008

(65) Prior Publication Data

US 2010/0041230 A1   Feb. 18, 2010

(51) Int. Cl.
*H01L 21/44* (2006.01)

(52) U.S. Cl. .................. 438/687; 438/457; 438/627; 438/660

(58) Field of Classification Search ............... None
See application file for complete search history.

(56) References Cited

U.S. PATENT DOCUMENTS

| | | | |
|---|---|---|---|
| 5,714,418 A * | 2/1998 | Bai et al. ................ | 438/627 |
| 6,043,153 A * | 3/2000 | Nogami et al. .......... | 438/687 |
| 6,342,733 B1 * | 1/2002 | Hu et al. ................. | 257/750 |
| 6,417,571 B1 | 7/2002 | Nogami et al. | |
| 6,478,935 B1 | 11/2002 | Ueno | |
| 6,670,639 B1 * | 12/2003 | Okabayashi et al. ..... | 257/64 |
| 7,259,095 B2 * | 8/2007 | Ueno ...................... | 438/686 |
| 7,282,255 B2 * | 10/2007 | Hiranaka et al. ......... | 428/209 |
| 7,301,236 B2 * | 11/2007 | Greco et al. ............. | 257/758 |
| 2007/0049020 A1 | 3/2007 | Huang et al. | |
| 2007/0131563 A1 | 6/2007 | Bogart et al. | |
| 2009/0174075 A1 * | 7/2009 | Yang et al. .............. | 257/751 |
| 2009/0206484 A1 * | 8/2009 | Baker-O'Neal et al. ... | 257/751 |

OTHER PUBLICATIONS

PCT Communication Relating to the Results of the Partial International Search for PCT/US2009/053270 mailed on Oct. 26, 2009.

* cited by examiner

*Primary Examiner*—Zandra Smith
*Assistant Examiner*—Khanh Duong
(74) *Attorney, Agent, or Firm*—Ingrassia Fisher & Lorenz, P.C.

(57) ABSTRACT

Methods for forming copper interconnects for semiconductor devices are provided. In an exemplary embodiment, a method for forming a copper interconnect comprises depositing copper into a trench formed in a dielectric material overlying a semiconductor material. A force is applied to the semiconductor material and stress is induced within the copper deposited in the trench. Recrystallization and grain growth are effected within the copper and the stress is removed.

27 Claims, 1 Drawing Sheet

METHODS FOR FORMING COPPER INTERCONNECTS FOR SEMICONDUCTOR DEVICES

FIELD OF THE INVENTION

The present invention generally relates to forming semiconductor structures, and more particularly relates to methods for forming copper interconnects for semiconductor devices.

BACKGROUND OF THE INVENTION

Interconnect lines (hereinafter, "interconnects") are commonly used to carry electricity in microcircuits. While interconnects are often formed of copper, a major reliability concern with copper interconnects is electromigration. Electromigration is the diffusion of copper caused by the gradual movement of copper ions due to the momentum transfer between conducting electrons and diffusing copper atoms. The effect is important in applications where high direct current densities are used, such as in microelectronics and related structures.

The grain structure of copper interconnects can have a profound influence on back end performance metrics such as electromigration performance (due to enhanced atomic mobility at grain boundaries). Thus, conventional processing of copper interconnects typically includes an annealing step used to control the crystal structure of the copper. Typically, the annealing is performed after the copper is deposited and before polishing removes excess copper, that is, the overburden. By annealing the copper within a trench with the overburden present, the overburden is able to facilitate recrystallization and grain growth of the copper such that columnar and "bamboo" grain structures grow. "Bamboo" grains are those that span the trench from the top surface of the copper to the bottom and from side to side with no grain boundary intersecting. Columnar grains span from the top to the bottom. FIG. 1 is a schematic cross-sectional illustration of a semiconductor structure 10 having three copper interconnects 12, 14, and 16 formed within a dielectric material layer 18. A barrier layer 20 is disposed within the trench to prevent or minimize the diffusion of the copper into the dielectric material layer. The wide copper interconnect 12 has a bamboo structure, as shown by grain boundaries 22 and 24. The wide interconnect 14 has columnar grain structures, as shown by grain boundaries 26, 28, and 30. These bamboo and columnar grain structures minimize electromigration effects.

However, as feature sizes of integrated circuits (ICs) decrease below 45 nm node technology, copper interconnects with bamboo and columnar grain structures become difficult to achieve and the practical significance of electromigration in copper interconnects increases. At 45 nm node technology and below, annealing results in "gravel defects" such as those of narrow interconnect 16 of FIG. 1. "Gravel defects" are small, non-columnar grains at the bottom of the trench, as shown by grain boundaries 32, 34, and 36. These grain boundaries form a grain boundary network that can significantly increase electromigration effects. Thus, methods for forming copper interconnects that achieve recrystallization and grain growth of the copper with bamboo and columnar grain structures are preferred.

Accordingly, it is desirable to provide methods for forming copper interconnects that exhibit minimal electromigration effects. In addition, it is desirable to provide methods for forming copper interconnects that utilize force to facilitate the recrystallization and grain growth of the copper into bamboo and columnar crystal structures during annealing. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method for forming a copper interconnect comprises depositing copper into a trench formed in a dielectric material overlying a semiconductor material. A force is applied to the semiconductor material and stress is induced within the copper deposited in the trench. Recrystallization and grain growth are effected within the copper and the force is removed.

In accordance with another exemplary embodiment of the present invention, a method for forming a copper interconnect comprises forming a trench within a dielectric material overlying a semiconductor material and depositing copper within the trench. A force is applied to the semiconductor material and a stress is induced within the copper. The stress facilitates recrystallization and grain growth of bamboo and columnar grain structures within the copper. The force is removed from the semiconductor material.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
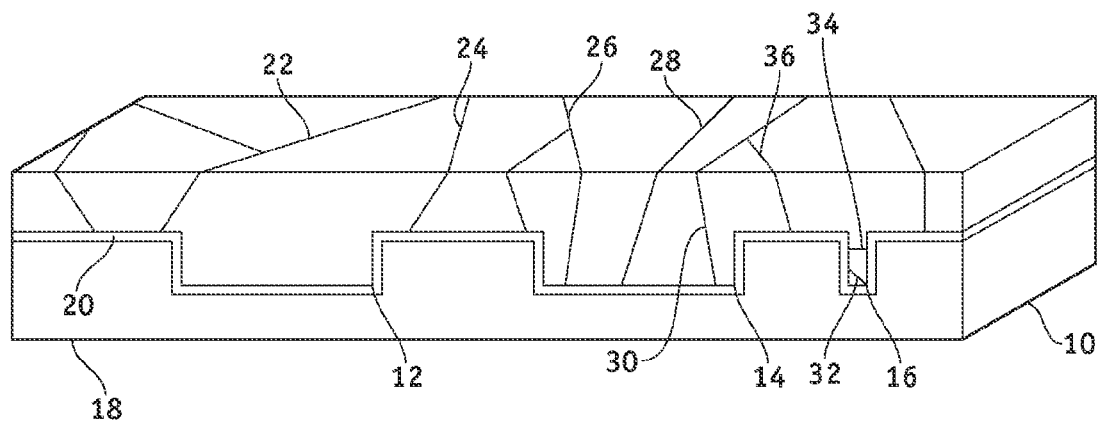
FIG. 1 is a cross-sectional view of copper interconnects formed within trenches of a dielectric material layer, wherein the copper interconnects have bamboo grain structures, columnar grain structures, and gravel defects.

Methods for the formation of copper interconnects for semiconductor devices are provided herein. The methods utilize the application of force to a semiconductor material underlying the copper. Due to application or removal of the force, a stress is induced within the copper that facilitates the formation of bamboo and columnar grain structures, such as those illustrated in FIG. 1. Bamboo-structured and columnar-structured copper interconnects, even those fabricated according to 45 nm node technology and smaller, evidence decreased electromigration and, hence, enhanced device performance.

Figure 2:
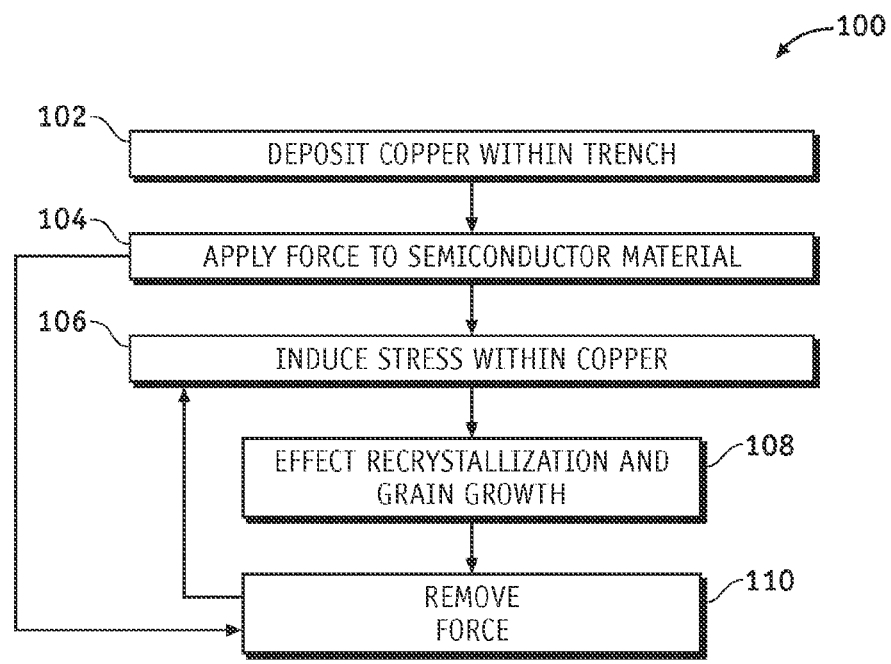
FIG. 2 is a method for forming copper interconnects for semiconductor devices in accordance with an exemplary embodiment of the invention.

FIG. 2 illustrates a method 100 for forming a copper interconnect in accordance with an exemplary embodiment of the present invention. The method includes the step of depositing copper into a trench formed in a dielectric material overlying a semiconductor material (step 102). As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer, or may be a thin layer of silicon on an insulating layer (commonly know as silicon-on-insulator or SOI) that, in turn, is supported by a carrier wafer.

The dielectric material may be formed of an insulating material such as a silicon oxide, silicon nitride, a low dielectric constant insulator such as a commercially available organo-silicate glass (OSG) material, for example, one of the CORAL™ family of low-k dielectric materials available from Novellus Systems, Inc., Black Diamond™ from Applied Materials of Santa Clara, Calif., and HOSP™ from Honeywell Electronic Materials of Chandler, Ariz., or the like. The dielectric material can be deposited overlying the semiconductor material, for example, by chemical vapor deposition (CVD), low pressure chemical vapor deposition (LPCVD), plasma-enhanced chemical vapor deposition (PECVD), physical vapor deposition (PVD), or atomic layer deposition (ALD). As used herein, the term "overlying" encompasses the terms "on" and "over." Accordingly, the dielectric material can be applied directly onto the semiconductor material or may be deposited over the semiconductor material such that one or more other materials are interposed between the dielectric material and the semiconductor material. The trench can be formed using conventional masking and etching steps as are well known in the art. The copper is deposited into the trench by, preferably, electroplating, which results in bottom-up fill deposition. However, the invention is not limited to electroplating of the copper, and other methods for depositing the copper into the trench can be used. In one exemplary embodiment, a barrier layer, such as, for example, titanium nitride, is deposited in the trench before deposition of the copper to minimize diffusion of the deposited copper into the dielectric material. Once the copper is deposited within the trench, any overburden of copper on the dielectric material, and barrier layer if present, may be removed, such as by chemical mechanical polishing (CMP), although in a preferred embodiment the overburden is not removed until after the copper has recrystallized, as explained in more detail below.

Method 100 also includes the step of inducing either tensile or compressive stress within the copper deposited within the trench (step 106). Stress can be induced within the copper using a variety of processes, such as by applying a force to the semiconductor material over which the copper is deposited (step 104). In accordance with one exemplary embodiment, a force can be applied to the semiconductor material and stress can be induced within the copper by bending the semiconductor material and then heat treating the bent semiconductor material, such as during an annealing process. Accordingly, the step of applying a force to the semiconductor material (step 104) and the step of inducing stress within the copper (step 106) are performed substantially simultaneously. One process for bending the semiconductor material includes chucking or securing the semiconductor material at its edges and exerting a force on either the front side of the semiconductor material to induce compressive stress in the copper or the backside of the semiconductor material to induce tensile stress in the copper. The force applied to the wafer may range from a few Newtons to a force below that force that would cause the semiconductor material to break. The force may be applied mechanically, hydrostatically, pneumatically, or the like.

The copper then undergoes recrystallization and grain growth so that bamboo and columnar grain structures form within the copper (step 108). In a preferred embodiment, recrystallization and grain growth is effected by heating the semiconductor material, and hence the copper, after the semiconductor material has been bent and while it remains bent. The semiconductor material can be heated to a temperature in the range of about from to 30° C. to 400° C. The semiconductor material may be heated while bent for a time sufficient for the copper to recrystallize within the trench and grow bamboo and columnar grain structures. In an exemplary embodiment, the semiconductor material is heated for a few minutes, such as when at higher temperatures, to up to about thirty minutes to an hour, such as when at lower temperatures. In another exemplary embodiment, recrystallization and grain growth in the copper are effected by resting the copper at a lower temperature, that is, within the range of about −50° C. to about 30° C., including room temperature (15° C. to 30° C.) for a time sufficient for the copper to recrystallize, usually for a period of days. Once the copper has had a sufficient opportunity to recrystallize and experience grain growth, the force applied to the semiconductor material can be removed (step 110) and stress is no longer externally induced within the wafer.

In accordance with another exemplary embodiment, stress can be induced within the copper by forming stress-modulating auxiliary layers overlying the semiconductor material. In this regard, after the copper is deposited within the trench (step 102), one or more auxiliary layers can be formed on the front (device) surface of the semiconductor material or on the back surface. Depending on its composition and on which surface of the semiconductor material the auxiliary layer is deposited, the auxiliary layer can apply a tensile or a compressive force to the semiconductor material (step 104), thus inducing a tensile or compressive stress within the deposited copper (step 106). One example of a suitable stress-modulating auxiliary layer is a plasma vapor deposition (PVD)-formed metal layer that is deposited overlying the electroplated copper. Suitable metals that may be used to form stress-modulating auxiliary layers include, but are not limited to, cobalt, tungsten, tantalum, tantalum nitride, titanium nitride, ruthenium, rhenium, rhodium, molybdenum, copper, chromium, vanadium, niobium, cadmium, and zirconium, and their respective oxides and nitrides. Other materials include low temperature-type polymers and other inorganic-based compounds or materials (hereinafter referred to collectively as "inorganic-based material"), that is, polymers or inorganic-based materials deposited at temperatures below about 100° C., preferably about room temperature (15° C. to 30° C.) such as OSG, polyimides, polyorylenes, polynorborenes, and epoxy resins. The stress-modulating auxiliary layers also may comprise spin-on inorganic-based materials. Inorganic-based materials and/or contemplated spin-on inorganic-based materials, such as silicon-based compounds or combinations thereof, are contemplated herein. Examples of silicon-based compounds comprise siloxanes and silsesquioxanes, such as, for example, alkylsiloxanes, alkylsilsesquioxanes, arylsiloxanes, arylsilsesquioxanes, alkenyl siloxanes, alkenylsilsesquioxanes, and mixtures thereof. It should be understood however that these contemplated inorganic materials may be applied overlying the semiconductor material by any suitable method or apparatus, including spin-on deposition, vapor deposition, chemical vapor deposition, electroplating, and the like as long as the deposition method does not cause the copper to recrystallize.

The thickness of the stress-modulating auxiliary layer is dependent on the desired amount of stress to be applied to the semiconductor material. In one embodiment, once the auxiliary layer is formed to its desired thickness, the semiconductor material is heat treated as described above to cause the copper to recrystallize and grow bamboo and columnar grain structures (step 108). The semiconductor material can be heated as described above. In another embodiment, the semiconductor material and, hence, the copper and the auxiliary layer are permitted to remain at room temperature for a time suitable to effect recrystallization and grain growth in the copper.

The stress-modulating auxiliary layer then is removed from the semiconductor material (step 110). In one embodiment, the auxiliary layer is deposited overlying the copper within the trench after any overburden is removed. However, in a preferred embodiment, the auxiliary layer is deposited overlying the copper before any overburden is removed. In this regard, once the appropriate stress is induced in the copper and the copper has transformed, the auxiliary layer can be removed from the semiconductor material with the overburden during a suitable polishing process.

In accordance with a further exemplary embodiment, stress can be induced within the copper by forming one or more stress-inducing layers having a coefficient of thermal expansion (CTE) different from the copper overlying the semiconductor material. In this regard, after the copper is deposited within the trench (step 102), one or more stress-inducing layers can be formed on the front (device) surface of the semiconductor material or on the back surface. The semiconductor material with the stress-inducing layer then is heated. As with the conventional processing, as the semiconductor material and, hence, the copper is heated, stress is induced within the copper. In addition, as the stress-inducing layer is heated with the copper, it expands more or less than the copper depending on its CTE, applying a tensile or a compressive force to the semiconductor material (step 104) and thus inducing further compressive or tensile stress, respectively, within the deposited copper (step 106). This additional stress facilitates the formation of bamboo and columnar grain structures within the copper (step 108). Examples of materials suitable for use as stress-inducing layers having CTEs different from copper include, but are not limited to, silicon dioxide, silicon nitride, and similar silicon-based glass materials, polymers such as, for example, polymethylmethacrylate and polyimide, and metals such as tantalum, tungsten, molybdenum, lead, zirconium, and the like. In one exemplary embodiment, because copper has a CTE of about $17 \times 10^{-6}/°$ C., the stress-inducing layer comprises materials, such as spin-on glasses, having a CTE of less than about $4 \times 10^{-6}/°$ C. In another embodiment, the stress-inducing layer comprises materials, such as epoxy resins, having a CTE of greater than about $60 \times 10^{-6}/°$ C. The material selected will depend on the magnitude of the tensile or compressive stress desired.

The stress-inducing layer then is removed from the semiconductor material (step 110). In one embodiment, the stress-inducing layer is deposited overlying the copper after any copper overburden is removed. However, in a preferred embodiment, the stress-inducing layer is deposited overlying the copper before any overburden is removed. In this regard, once the appropriate stress is induced in the copper and the copper has transformed, the stress-inducing layer can be removed from the semiconductor material with the overburden during a suitable polishing process.

In accordance with another exemplary embodiment, stress can be induced within the copper by removing a force applied to the semiconductor material, that is, the step of inducing stress within the copper (step 106) and the step of removing a force applied to the semiconductor material (step 110) are performed substantially simultaneously. For example, in one embodiment, the semiconductor material can be bent while the copper is being deposited in the trench (step 104). The semiconductor material then is permitted to return to its original shape (step 110). As the semiconductor material returns to its original shape, tensile or compressive stress is induced in the deposited copper, depending on whether the semiconductor material was bent inward towards its front (device) surface or outward towards its backs surface, respectively.

In this regard, the semiconductor material can be bent using the process described above, although other methods for bending the semiconductor also can be used. Once the semiconductor material is bent, it can be immersed into an electroplating solution so that electroplating of the copper in the trench can be achieved. After electroplating is complete, the force applied to bend the wafer is removed (step 110), thus inducing a stress within the copper (step 106). After the force applied to the semiconductor material is removed, the copper recrystallizes and grows the desired bamboo and columnar grain structures (step 108).

In one exemplary embodiment, after electroplating is complete, the semiconductor material, and hence the copper, is heated as described above while the semiconductor material is still bent. As the copper is heated, stress is induced in the deposited copper (step 106), causing it to recrystallize and grow into bamboo and columnar grain structures (step 108). During or after heating, the force applied to bend the wafer is removed (step 110), thus inducing even further stress within the copper (step 106) and further facilitating bamboo and columnar grain growth. Alternatively, the semiconductor material may be heated after the force applied to bend the semiconductor material is removed. In another exemplary embodiment, after electroplating is complete, the bent semiconductor material and, hence, copper are permitted to remain at room temperature for a time suitable to permit the copper to at least partially recrystallize and grow bamboo and columnar grain structures (step 108). The force applied to bend the wafer then is removed (step 110), thus inducing even further stress within the copper (step 106) and further facilitating bamboo and columnar grain growth. In yet another exemplary embodiment, after electroplating is complete, the force applied to bend the wafer is removed (step 110), thus inducing stress within the copper (step 106) and facilitating bamboo and columnar grain growth (step 108). The semiconductor material and, hence, copper then are permitted to remain at room temperature for a time suitable to permit the copper to further recrystallize.

Accordingly, methods for the formation of copper interconnects have been disclosed herein. The methods utilize the application of force to the semiconductor material which the copper overlies. Due to application or removal of the force, a stress is induced within the copper that facilitates the formation of bamboo and columnar grain structures. The bamboo- and columnar-structured copper interconnect, even when fabricated according to 45 nm node technology or smaller, evidences decreased electromigration and, hence, enhanced device performance.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a semiconductor device, the method comprising the steps of:
depositing copper into a trench formed in a dielectric material overlying a semiconductor material;
applying a force to the semiconductor material;
inducing stress within the copper deposited in the trench;
effecting recrystallization and columnar and bamboo grain structure growth within the copper; and
removing the force.

2. The method of claim 1, wherein the step of applying a force comprises applying a tensile or a compressive force.

3. The method of claim 1, wherein the step of applying a force comprises bending the semiconductor material.

4. The method of claim 3, wherein the step of bending comprises securing the semiconductor material and exerting a force on a front surface or a back surface of the semiconductor material.

5. The method of claim 3, further comprising the step of heating the semiconductor material while the semiconductor material is bent.

6. The method of claim 3, wherein the step of effecting comprises the step of bending the semiconductor material at room temperature for a time sufficient to effect recrystallization.

7. The method of claim 1, wherein the step of applying a force comprises applying a force to the semiconductor material to bend the semiconductor material and wherein the step of depositing is performed after the step of applying.

8. The method of claim 7, wherein the step of inducing stress and the step of removing the force are performed substantially simultaneously.

9. The method of claim 8, further comprising the step of heating the semiconductor material before the step of removing.

10. The method of claim 9, further comprising the step of heating the semiconductor material after the step of removing.

11. The method of claim 1, wherein the step of applying a force comprises forming a stress-modulating auxiliary layer overlying the semiconductor material.

12. The method of claim 11, wherein the step of forming comprises the step of forming a PVD-formed metal layer.

13. The method of claim 11, further comprising the step of heating the semiconductor material after the step of forming a stress-modulating auxiliary layer.

14. The method of claim 11, further comprising the step of removing the stress-modulating auxiliary layer, the step of removing performed during a step of removing any excess copper from the semiconductor material.

15. The method of claim 1, wherein the step of applying a force comprises the steps of forming overlying the semiconductor material a stress-inducing layer having a coefficient of thermal expansion different from copper and heating the semiconductor material and the stress-inducing layer.

16. The method of claim 15, further comprising the step of removing the stress-inducing layer, the step of removing performed during a step of removing any excess copper from the semiconductor material.

17. A method for forming a semiconductor device, the method comprising the steps of:
forming a trench within a dielectric material overlying a semiconductor material;
depositing copper within the trench;
applying a force to the semiconductor material;
inducing a stress within the copper, the stress facilitating recrystallization and grain growth of bamboo and columnar grain structures within the copper; and
removing the force from the semiconductor material.

18. The method of claim 17, wherein the step of applying comprises applying a force to bend the semiconductor material.

19. The method of claim 18, wherein the step of inducing comprises heating the semiconductor material.

20. The method of claim 17, wherein the step of applying comprises the step of applying a force to bend the semiconductor material and wherein the step of depositing is performed after the step of applying.

21. The method of claim 20, wherein the step of removing comprises the step of removing the force and wherein the step of inducing and the step of removing the force are performed substantially simultaneously.

22. The method of claim 20, further comprising the step of heating the semiconductor material, the step of heating performed after the step of removing the force.

23. The method of claim 20, further comprising the step of heating the semiconductor material, the step of heating performed during the step of applying a force to bend the semiconductor material.

24. The method of claim 17, wherein the step of applying comprises the step of forming a stress-modulating auxiliary layer overlying the semiconductor material.

25. The method of claim 24, wherein the step of forming a stress-modulating auxiliary layer comprise forming a PVD-formed copper layer.

26. The method of claim 24, further comprising the step of heating the semiconductor material, the step of heating performed after the step of forming.

27. The method of claim 17, wherein the step of applying comprises the steps of forming overlying the semiconductor material a stress-inducing layer having a coefficient of thermal expansion different from copper and heating the stress-inducing layer.

* * * * *